Figure 1:
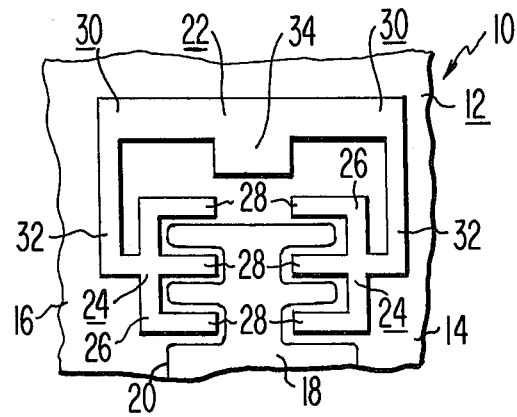

United States Patent [19]

Wheatley, Jr.

[11] 4,091,409
[45] May 23, 1978

[54] SEMICONDUCTOR DEVICE HAVING SYMMETRICAL CURRENT DISTRIBUTION

[75] Inventor: Carl Franklin Wheatley, Jr., Somerset, N.J.

[73] Assignee: RCA Corporation, New York, N.Y.

[21] Appl. No.: 754,683

[22] Filed: Dec. 27, 1976

[51] Int. Cl.² .................. H01L 23/48; H01L 29/44; H01L 29/52
[52] U.S. Cl. ........................... 357/68; 357/36; 357/39; 357/65
[58] Field of Search ............... 357/65, 36, 38, 39, 357/68

[56] References Cited

U.S. PATENT DOCUMENTS

| 3,430,115 | 2/1969 | Gilbert | 357/68 |
| 3,609,460 | 9/1971 | Ollendorf | 357/68 |
| 3,619,738 | 11/1971 | Otsuka | 357/68 |
| 3,756,924 | 9/1973 | Collins et al. | 357/68 |

Primary Examiner—Andrew J. James
Attorney, Agent, or Firm—H. Christoffersen; R. A. Hays

[57] ABSTRACT

A semicondutor device has an electrode with a configuration having a trunk portion and at least one comb-like portion. The comb-like portion has a back with ends and a plurality of conductive fingers extending therefrom. The trunk portion has a segment which is substantially parallel to the back of the comb-like portion. The trunk portion contacts the comb-like portion at a point intermediate the ends of the back.

6 Claims, 3 Drawing Figures

SEMICONDUCTOR DEVICE HAVING SYMMETRICAL CURRENT DISTRIBUTION

The present invention relates generally to semiconductor devices, and, in particular, relates to those devices having at least one surface region to be contacted by an electrode.

A major problem of conventional semiconductor devices, particularly transistors having interdigitated base-emitter structures, is that each finger portion of the interdigitated region operates at a different voltage potential. That is, where an electrode extends from a terminal pad and weaves along the periphery of the finger portions there is a considerable voltage drop between the finger portions near the terminal pad and the finger portions further away, the relative distance of the finger portions to the terminal pad being measured along the electrode. The same condition exists in an electrode configuration wherein a trunk portion extends from a terminal pad and has a plurality of conductive fingers protruding directly therefrom into the finger portions of the interdigitated region. Such a voltage imbalance between the finger portions can cause a semiconductor device to be unstable.

In additon to the unbalanced voltage distribution itself, the electrode fingers nearer the terminal pad, in order to assure that the electrode fingers further away are maintained at some minimum operating voltage, are usually overbiased, i.e., maintained at a voltage which is greater than necessary for proper operation. Consequently, more current flows into the finger portions of the interdigitated region nearer the terminal pad than into the finger portions further away. This results in excessive current flow in those finger portions which can create hot spots which can damage or destroy a device.

Conventional attempts to solve the above problems have generally been directed toward reducing the resistance of the trunk and thereby reducing the voltage drop differences between the fingers. One such solution is to form the trunk from a material having an increased conductivity. Another solution is to increase either the thickness or width, or both, of the electrode.

Although these solutions succeed in reducing the resistance of the trunk, and hence the voltage drop differences between the electrode fingers, the basic problem remains. It is thus desirable to provide an electrode configuration which directly substantially eliminates the voltage drop differences between electrode fingers.

Figure 2:
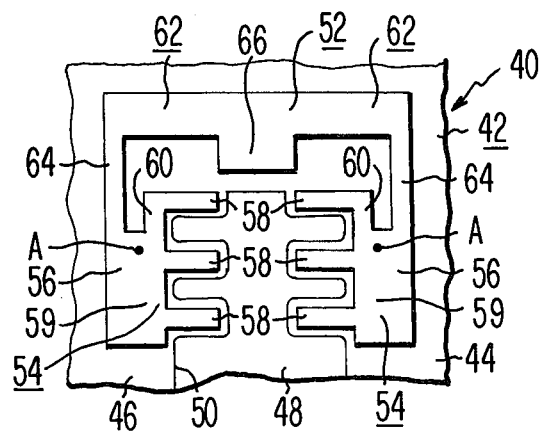
Figure 3:
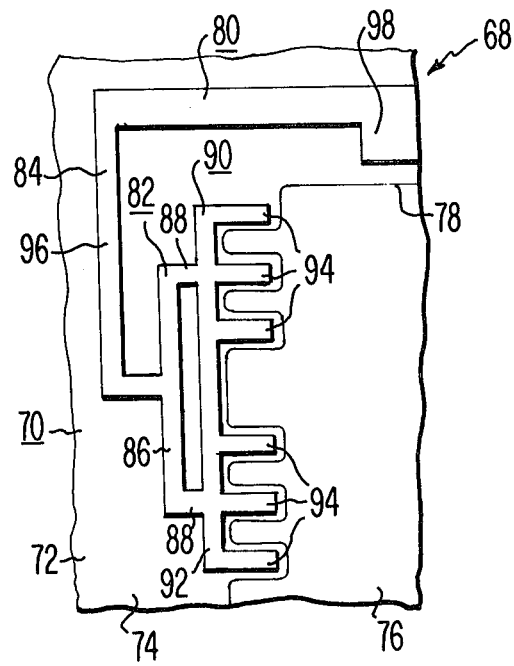

In the drawings:

FIGS. 1 through 3 are partial plan views of various embodiments of the present electrode configuration, not drawn to scale.

A semiconductor device, indicated generally at 10 in FIG. 1, comprises a body 12 of semiconductor material having a surface 14.

A first region 16 having a one type conductivity, for example, P type, is within the body 12 and adjacent the surface 14. While the first region 16 is described herein as having a P type conductivity, it can also be of N type conductivity so long as all other conductivity types specified herein are likewise changed.

At least one second region 18 having another type conductivity, N type in this embodiment, is within the first region 16 and adjacent the surface 14. The second region 18 forms a PN junction 20 with the first region 16 at the interface therewith. Preferably the first region 16 and the second region 18 are interdigitated although other shapes may also be used, for example the second region 18 can have a surface intercept in the shape of a grid, not shown in the drawings. By interdigitated it is meant that finger portions of the first region 16 are interlaced with similar finger portions of the second region 18.

A layer 22 of conductive material electrically contacts the first region 16 and constitutes an electrode. Preferably, the layer 22 contacts the first region 16 only at the finger portions thereof. That is, the layer 22 on the body 12 may be spaced apart from the first region 16 by a layer of insulating material, not shown in the drawings, which has openings therein which expose the finger portions and allow the layer 22 to contact the first region 16 therethrough. The layer 22 has a configuration comprising a comb-like portion 24 having a back 26 with ends and a plurality of fingers 28 extending over the finger portions of the first region 16. The configuration also comprises a trunk portion 30 which has a segment 32 thereof which is substantially parallel to the back 26 of the comb-like portion 24. The trunk portion 30 extends from a terminal pad 34 and one end thereof contacts the back 26 of the comb-like portion 24 at a point intermediate the ends thereof.

Operationally it is preferred, in this embodiment, that the plurality of fingers 28 be substantially symmetrically distributed along the back 26 with respect to the point of contact of the one end of the trunk portion 30. This criteria assures that the maximum voltage drop between the point of contact of the one end of the trunk portion 32 with the back 26 and the furthest finger 28 away therefrom is considerably less than the voltage drop would be if the trunk portion 32 contacted the back 26 at an end thereof.

The degree of difference between the voltage drop of the present embodiment and a configuration, not shown in the drawings, wherein the trunk portion contacts the back at an end thereof is demonstrated by the calculations below.

The average voltage drop ($\Delta V$) of a conductive electrode is given by the general formula $\Delta V = IR/2$ wherein:

I is the current; and
R is the resistance of the back

The resistance R may be written as: $R = (l/w)\rho_s$ wherein:

$l$ is the path length,
$w$ is the path width; and
$\rho_s$ is the sheet resistivity of the material of the back.

Therefore, for the configuration wherein the trunk contacts an end of the back, not shown in the drawings, the voltage drop along the back would be $\Delta V_1 = Il/2w \, \rho_s$.

For the present embodiment, shown in FIG. 1, the current and the path length are one-half that of the above configuration since the contact point is intermediate the ends of the back 26 and the fingers 28 are symmetrical therewith.

Therefore, for the electrode of the present embodiment:

$$\Delta V_2 = \frac{(\frac{I}{2})(\frac{l}{2})}{2w} \rho_s = \frac{(\frac{Il}{4})}{2w} \rho_s = \frac{Il}{8w} \rho_s =$$

$$\frac{Il}{2w}\left(\frac{1}{4}\right)\rho_s = \left(\frac{(\Delta V_1)}{4}\right)$$

Hence, the voltage drop differential between the point of contact of the one end of the trunk to the back and the finger most distant therefrom is 4 times less in the present embodiment than in the configuration wherein the trunk portion contacts an end of the back.

A number of inherent advantages are derived from the use of the present embodiment and the accompanying relatively large reduction the voltage drop differential. Initially, since the primary objective of any electrode design is to deliver a particular operating voltage to the finger 28 furthest from the trunk portion contact point, it is clear that the voltage potential, in the present embodiment, at the point of contact between the trunk portion 30 and the back 26 can be considerably less, due to the reduced voltage drop to the fingers 28, than that required were the trunk portion 30 to contact an end of the back 26. Since the maximum voltage drop along the back portion 26 is reduced by the present embodiment the size of the trunk portion 30 compared to the size of the trunk portion which contacts an end of the back, can be reduced. While a reduction in size increases the resistance of the trunk portion 30 the surface area of the overall device, however, can be reduced. This is an important aspect since chip area is usually at a premium in semiconductor device technology.

In addition to the voltage drop between the trunk contact point and the fingers furthest therefrom, another consideration in the design of an electrode configuration is the voltage drop between adjacent fingers. A reduction in the voltage drop between adjacent fingers can be obtained through the use of a second embodiment of the present configuration. Such a configuration is shown in FIG. 2 of the drawings.

The device 40 shown in FIG. 2 is similar to the device 10 in that it comprises a body 42 of semiconductor material having a surface 44.

A first region 46 having a one type conductivity is within the body 42 and adjacent the surface 44. A second region 48 having another type conductivity is within the first region 46 and adjacent the surface 44. Preferably the first region 46 and the second region 48 are interdigitated. A PN junction 50 is formed at the interdigitated interface between the first region 46 and the second region 48.

A layer 52 of conductive material electrically contacts the first region 46 and constitutes an electrode. The layer 52 has a configuration comprising a comb-like portion 54 having a back 56 with ends and a plurality of fingers 58 extending over portions of the first region 46. In this embodiment the back has a comparatively wider portion 59 near one end and a comparatively narrower portion 60 near the other end. The layer 52 also comprises a trunk portion 62 which has a segment 64 thereof substantially parallel to the back 56. The trunk portion 62 extends from a terminal pad 66 and contacts the back 56 of the comb-like portion 54 at a point 'A' intermediate the ends thereof. Preferably, the point 'A' is asymmetrically located with respect to the fingers 58. That is, it contacts the back 56 nearer to the comparatively narrower end thereof.

Operationally, by utilizing calculations similar to those presented above, the extent of the comparatively wider portion 59 and the point 'A' of contact can be determined so that the voltage drops between the point 'A' and each end of the back 56 are equal. Since the resistance of the comparatively wider portion 59 is less than that of the comparatively narrower portion 60 the point 'A' will be nearer the end of the back 56 having the comparatively narrower portion 60. Because of this location the voltage drop between adjacent fingers 58 along the narrower portion 60 is reduced, there being a larger voltage potential nearer the end of the narrower portion 60 due to the asymmetrical location of 'A'. Further, because of the lower resistance of the comparatively wider portion 59 the voltage drop between adjacent fingers 58 therealong is also reduced. Thus, the configuration of the layer 52 of this embodiment not only reduces the voltage drop between the trunk portion contact point 'A' and the fingers 58 furthest therefrom but also reduces the voltage drop between adjacent fingers. As a result, the fingers 58 are at substantially the same voltage potential during the operation of the device 40.

Referring back to the device 10 as shown in FIG. 1 it is observed that as the number of fingers 28 extending from the back 26 increases, the need for further voltage drop equalization also increases. This need can be substantially fulfilled by utilizing the configuration as shown in FIG. 3 of the drawings. Therein a device 68 comprises a body 70 of semiconductor material having a surface 72. The device 68 further comprises a first region 74 having a one type conductivity within the body 70 and adjacent the surface 72.

A second region 76 having another type conductivity is within the first region 74 and adjacent the surface 72. Preferably, the first region 74 and the second region 76 are interdigitated. An interdigitated PN junction 78 is formed at the interface between the first region 74 and the second region 76.

A layer 80 of conductive material overlies and electrically contacts the first region 74. The layer 80 has a configuration comprising a first comb-like portion 82 and a trunk portion 84. The first comb-like portion 82 has a first back 86 with ends and a first plurality of fingers 88 extending therefrom. In this embodiment the first plurality of fingers 88 are preferably substantially equally distributed along the first back 86.

A second comb-like portion 90, preferably being spaced apart from and substantially parallel with the first comb-like portion 82, has a second back 92 with ends and a second plurality of fingers 94 extending therefrom. The second back 92 is contacted by the first plurality of fingers 88. Preferably, in this embodiment, the contacts are substantially symmetrical along the second back 92.

The trunk portion 84 has a segment 96 which is substantially parallel with both the first back 86 and the second back 92. The trunk portion 84 extends from a terminal pad 98 to the first comb-like portion 82 and one end of the trunk contacts the first back 86 intermediate the ends thereof.

Operationally this embodiment can be visualized as being a pair of configuraions as described above in relation to the device 10 connected in tandem. That is, the first comb-like portion 82 serves as a subfeeder wherein each of the first plurality of fingers 88 serves as a trunk-like portion contacting the second comb-like portion 90. As discussed above, the voltage drops between the trunk portion 84 and each of the first plurality of fingers 88 are substantially equal. Hence, since the plurality of fingers 88 contact the second back 92 in a substantially symmetrical fashion, the voltage drops between each of the first plurality of fingers 88 and each of the second plurality of fingers 94 are substantially equal. Therefore, the voltage drops between the trunk portion 84 and each of the second plurality of fingers 94 are substantially the same. This tandem principle can also be used for the configuration of the device 40 shown in FIG. 2.

The layers 22, 52 and 80 of conductive material can be, for example gold, nickel-lead or the like. These configurations can be formed using known methods in the art such as photolithographic techniques.

While the above discussion has been directed to devices having interdigitated regions the electrode configurations are equally applicable to devices having a plurality of discrete areas at the surface which are contacted by a single electrode.

The present novel devices 10, 40 and 68 have substantially reduced voltage drops between the fingers 28, 58 and 94, respectively, of the electrodes thereof and hence there is little cause to overbias any of those fingers 28, 58 or 94. Therefore, there is little chance of hot spots, due to excessive currents from unbalanced voltage distributions, damaging the devices 10, 40 or 68.

What is claimed is:

1. A semiconductor device comprising:
   a body of semiconductor material having a surface, and
   a layer of conductive material on said body, said layer having a configuration comprising; a first comb-like portion having a first back with ends and a first plurality of fingers extending from said first back; said configuration also comprising a trunk portion having a segment substantially parallel to said first back of said first comb-like portion, one end said trunk portion contacting said first back of said first comb-like portion at a point intermediate said ends thereof.

2. A semiconductor device as claimed in claim 1 wherein:
   said first plurality of fingers are substantially equally distributed along said first back and said one end of said trunk portion contacts said first back at a substantially symmetrical point therealong.

3. A semiconductor device as claimed in claim 1 wherein;
   said first back has a comparatively narrower portion near one end and a comparatively wider portion near another end; and
   said one end of said trunk portion contacts said first back at a point nearer said one end.

4. A semiconductor device as claimed in claim 1 further comprising:
   a second comb-like portion having a second back with ends and a second plurality of fingers extending therefrom said second back being contacted by said first plurality of fingers.

5. A semiconductor device as claimed in claim 4 wherein:
   said second plurality of fingers are substantially equally distributed along said second back.

6. A semiconductor device as claimed in claim 4 wherein
   said second back is substantially parallel to and spaced apart from said first back.

* * * * *